(12) United States Patent
Di Stefano et al.

(10) Patent No.: US 10,571,510 B2
(45) Date of Patent: Feb. 25, 2020

(54) PARTIAL DISCHARGE ACQUISITION SYSTEM COMPRISING A CAPACITIVE COUPLING ELECTRIC FIELD SENSOR

(71) Applicant: Prysmian S.p.A., Milan (IT)

(72) Inventors: Antonio Di Stefano, Milan (IT); Roberto Candela, Milan (IT); Giuseppe Fiscelli, Milan (IT)

(73) Assignee: PRYSMIAN S.p.A., Milan (IT)

( * ) Notice: Subject to any disclaimer, the term of this patent is extended or adjusted under 35 U.S.C. 154(b) by 277 days.

(21) Appl. No.: 15/311,327

(22) PCT Filed: May 16, 2014

(86) PCT No.: PCT/EP2014/060141
§ 371 (c)(1),
(2) Date: Nov. 15, 2016

(87) PCT Pub. No.: WO2015/172849
PCT Pub. Date: Nov. 19, 2015

(65) Prior Publication Data
US 2017/0074920 A1    Mar. 16, 2017

(51) Int. Cl.
*G01R 31/16*    (2006.01)
*G01R 31/12*    (2006.01)
(Continued)

(52) U.S. Cl.
CPC ............. *G01R 31/16* (2013.01); *G01R 29/12* (2013.01); *G01R 29/26* (2013.01); *G01R 31/1272* (2013.01); *G01R 31/14* (2013.01)

(58) Field of Classification Search
CPC .... G01R 31/16; G01R 31/1272; G01R 31/14; G01R 29/12; G01R 29/26
See application file for complete search history.

(56) References Cited

U.S. PATENT DOCUMENTS 4,277,746 A  *  7/1981  Abe ...................... H01H 33/26
                                                            174/11 R
5,481,195 A  *  1/1996  Meyer ................... G01R 31/11
                                                               324/533
(Continued)

FOREIGN PATENT DOCUMENTS

EP          0 984 289          3/2000
WO       WO 2009/150627       12/2009
(Continued)

OTHER PUBLICATIONS

Heintzelman et al., Characterization and Analysis of Electric-field Sensors, 2015.*
(Continued)

*Primary Examiner* — Patrick Assouad
*Assistant Examiner* — Sean Curtis
(74) *Attorney, Agent, or Firm* — Finnegan, Henderson, Farabow, Garrett & Dunner, L.L.P.

(57) ABSTRACT

A partial discharge detecting device includes an electric field sensor including: a first electrode configured to detect by capacitive coupling a partial discharge signal generated by an electrical object and to provide a corresponding first electrical signal, and a second electrode isolated from the first electrode and structured to detect an environmental noise and to provide a corresponding second electrical signal. The detecting device further includes a transmission line structured to propagate an output signal obtained from the electric field sensor toward an external analysis apparatus and an electronic module connected to the first and second electrodes and structured to process the first and second electrical signals and to provide the output signal to the transmission line. The electronic module is structured to decouple the electric field sensor from the transmission line (Continued)

and avoid resonance of the electric field sensor with the transmission line.

17 Claims, 5 Drawing Sheets

(51) Int. Cl.
*G01R 29/12* (2006.01)
*G01R 29/26* (2006.01)
*G01R 31/14* (2006.01)

(56) References Cited

U.S. PATENT DOCUMENTS

| | | | | |
|---|---|---|---|---|
| 5,618,759 | A * | 4/1997 | Boysel | B25B 11/005 |
| | | | | 438/464 |
| 5,804,972 | A * | 9/1998 | de Kock | G01R 31/1281 |
| | | | | 324/455 |
| 5,814,998 | A * | 9/1998 | Gruenewald | G01R 31/1227 |
| | | | | 324/535 |
| 5,903,158 | A * | 5/1999 | Eriksson | G01R 31/1227 |
| | | | | 324/536 |
| 5,933,012 | A * | 8/1999 | Bengtsson | G01R 15/181 |
| | | | | 324/524 |
| 6,078,180 | A * | 6/2000 | Jenkinson | G01R 31/12 |
| | | | | 324/536 |
| 6,088,658 | A * | 7/2000 | Yazici | G01R 31/1272 |
| | | | | 702/180 |
| 6,246,177 | B1 * | 6/2001 | Xie | G09G 3/22 |
| | | | | 313/309 |
| 6,255,808 | B1 * | 7/2001 | Hucker | G01R 31/1254 |
| | | | | 250/206.1 |
| 6,850,399 | B1 * | 2/2005 | Kato | G01R 15/142 |
| | | | | 361/132 |
| 6,853,528 | B2 * | 2/2005 | Kato | H02B 13/0356 |
| | | | | 361/132 |
| 7,027,280 | B2 * | 4/2006 | Kato | H01H 33/027 |
| | | | | 361/93.1 |
| 7,064,267 | B2 * | 6/2006 | Kato | G01R 15/142 |
| | | | | 174/138 F |
| 7,208,958 | B2 * | 4/2007 | Raja | G01R 31/1272 |
| | | | | 324/515 |
| 7,397,307 | B2 * | 7/2008 | Stoger | H03F 1/34 |
| | | | | 330/254 |
| 7,411,401 | B1 * | 8/2008 | Hull | G01R 29/12 |
| | | | | 324/457 |
| 7,868,755 | B2 * | 1/2011 | Hanai | G01K 1/024 |
| | | | | 340/539.22 |
| 8,792,542 | B2 * | 7/2014 | McMeekin | G01R 19/0053 |
| | | | | 375/146 |
| 8,816,700 | B2 * | 8/2014 | Di Stefano | G01R 31/1272 |
| | | | | 324/536 |
| 9,209,152 | B2 * | 12/2015 | Goh | H01L 23/36 |
| 9,229,043 | B2 * | 1/2016 | Hobelsberger | G01R 15/16 |
| 9,482,697 | B2 * | 11/2016 | Javora | G01R 31/1254 |
| 9,753,080 | B2 * | 9/2017 | Andle | G01R 31/1272 |
| 9,933,474 | B2 * | 4/2018 | Candela | G01R 31/025 |
| 2011/0156720 | A1 * | 6/2011 | Di Stefano | G01R 31/1272 |
| | | | | 324/629 |
| 2011/0204899 | A1 * | 8/2011 | Klepper | G01R 31/08 |
| | | | | 324/532 |
| 2013/0234726 | A1 * | 9/2013 | Hobelsberger | G01R 15/16 |
| | | | | 324/551 |
| 2013/0237162 | A1 * | 9/2013 | Yoon | H01Q 5/328 |
| | | | | 455/77 |
| 2013/0271116 | A1 * | 10/2013 | Javora | G01R 31/1254 |
| | | | | 324/114 |
| 2013/0300435 | A1 * | 11/2013 | Chi | G01R 19/0023 |
| | | | | 324/658 |
| 2014/0002098 | A1 * | 1/2014 | Sales Casals | G01R 31/08 |
| | | | | 324/521 |
| 2014/0009397 | A1 * | 1/2014 | Gillespie | G06F 3/0312 |
| | | | | 345/163 |
| 2015/0160282 | A1 * | 6/2015 | Candela | G01R 31/025 |
| | | | | 324/551 |
| 2015/0260777 | A1 * | 9/2015 | Di Stefano | G01R 31/1227 |
| | | | | 324/536 |
| 2016/0116520 | A1 * | 4/2016 | Di Stefano | G06N 3/10 |
| | | | | 702/58 |
| 2016/0161543 | A1 * | 6/2016 | Andle | G01R 31/1272 |
| | | | | 324/551 |
| 2016/0274176 | A1 * | 9/2016 | Di Stefano | G01R 31/1227 |
| 2016/0336047 | A1 * | 11/2016 | Benedict | H01L 23/49838 |
| 2017/0074920 | A1 * | 3/2017 | Di Stefano | G01R 31/1272 |

FOREIGN PATENT DOCUMENTS

| | | | | |
|---|---|---|---|---|
| WO | WO 2009150627 | A2 * | 12/2009 | G01R 31/1272 |
| WO | WO 2013/185820 | | 12/2013 | |
| WO | WO 2013185820 | A1 * | 12/2013 | G01R 31/1227 |
| WO | WO-2013185820 | A1 * | 12/2013 | |

OTHER PUBLICATIONS

Hibbs et al., Capacitive electric field sensors for electromagnetic geophysics, GroundMetrics, Inc., and Quasar Federal Systems, Inc. (QFS). Oct. 2012 (Year: 2012).*

Coonrod, John. Microstrip Versus Stripline: How to Make the Choice. Dec. 20, 2010. Rog Bldg. (Year: 2010).*

International Search Report from the European Patent Office for International Application No. PCT/EP2014/060141, dated Jan. 22, 2015.

Written Opinion of the International Searching Authority from the European Patent Office for International Application No. PCT/EP2014/060141, dated Jan. 22, 2015.

Sun et al.; "Measurement, Diagnostics and Monitoring of Partial Discharges on High-Voltage Equipment On-Line and Off-Line", IEEE, ICIEA, pp. 1521-1526, (2009).

* cited by examiner

A)

B)

PARTIAL DISCHARGE ACQUISITION SYSTEM COMPRISING A CAPACITIVE COUPLING ELECTRIC FIELD SENSOR

CROSS REFERENCE TO RELATED APPLICATION

This application is a nation phase application based on PCT/EP2014/060141, filed May 16, 2014, the content of which is incorporated herein by reference.

BACKGROUND

Technical field

The present invention relates to partial discharge detection and acquisition system, and particularly, refers to partial discharge sensors.

Description of the Related Art

Partial discharge detection is particularly used for identifying and measuring partial discharges in electrical components and apparatus, such as: medium, high or extra-high voltage cables, cable joints, overhead line insulators, medium and high voltage switchboard boxes, high and extra-high voltage cables using GIS (Gas Insulated Switchgear).

The term partial discharges is intended to indicate an undesired recombination of electric charges occurring in the dielectric (insulating) material of electric components, when the latter have defects of various types, eventually leading to dielectric destruction. Here, a pulse current is generated in portions of dielectric material and causes an electromagnetic wave to propagate through the power or ground cables of the relevant electric system, and radiating through the various surrounding media (dielectric material, metals, air, etc.).

For executing partial discharge measurements on AC (Alternate Current) electrical components, a phase reference signal has to be detected, i.e. a signal that is synchronized in phase and frequency with the AC voltage powering of the AC electrical component.

The detected partial discharge signal and the phase reference signal are processed in an acquisition and analysis device which provides a representation of the detected partial discharge pulses with respect to the phase reference signal, allowing a final diagnosis of the electrical object under test.

Document WO-A-2009-150627 describes, inter alia, a partial discharge detection device of small size, totally insulated and self-powered, which allows measurements to be performed with the highest safety with no need for direct connection to the system under examination. This partial discharge detection device can also detect a synchronization signal, which is obtained by picking up the supply voltage of the discharge generating components.

Document EP0984289 describes a partial discharge detector for gas insulated apparatus (GIS), provided with an antenna unit, a coaxial cable and a remote measuring unit connected to the coaxial cable.

Document "Design and application of electric-field sensor for measuring PD signals in high voltage equipments", K. W. Lee et al.; Proceedings of the International Conference of Properties and applications of Dielectric Materials June 1-5 2003—Nagoya, describes a partial discharge capacitor sensor comprising a first aluminium sheet connected to an input terminal and a second aluminium sheet connected to an output terminal and a polyester film placed between the two sheets. The described capacitor sensor, having a capacitance of about 1400 pF, shows a resonant frequency at 9.8 MHz.

BRIEF SUMMARY OF THE INVENTION

The Applicant observes that the known partial discharge electric field sensors do not provide satisfying performances with reference to the preservation of the shape of the detected partial discharge pulse. Particularly, the Applicant notices that prior art techniques do not solve performance problems when the detected partial discharge pulses are transmitted towards an acquisition and analysis apparatus by means of a transmission line.

In fact, the Applicant observes that transmission lines have a natural inductive (or capacitive) behaviour and could resonate with the electric field sensor distorting, consequently, the detected partial discharge pulses sensed.

Therefore, it has been found that it is convenient to operate the electric field sensor far away from its resonance frequency and subsequently to transmit the detected partial discharge pulse to an acquisition and analysis apparatus through the transmission line, without affecting it by the natural inductive (or capacitive) behaviour of the transmission line itself.

The Applicant has found that a partial discharge electric field sensor comprising an electronic circuit structured to decouple the electric field sensor from the transmission line allows to avoid resonance of the transmission line with the electric field sensor.

According to a first aspect, the present invention relates to a partial discharge detecting device, comprising:
an electric field sensor comprising: a first electrode configured to detect by capacitive coupling a partial discharge signal generated by an electric object and provide a corresponding first electrical signal and a second electrode isolated from the first electrode and structured to detect an environmental noise and provide a corresponding second electrical signal;
a transmission line structured to propagate an output signal obtained from the electric field sensor towards an external analysis apparatus; and
an electronic module connected to the first and second electrodes and structured to process the first and second electrical signals and provide the output signal to the transmission line; wherein the electronic module is structured to decouple the electric field sensor from the transmission line so as to substantially avoid resonance of the electric field sensor with the transmission line.

In an embodiment, said electronic module includes: a differential amplifier electrically connected to the first and second electrodes, and having an input impedance independent from an output load seen from said differential amplifier. In particular, an input impedance of an electronic circuit is intended to be independent from the output load of the same electronic circuit when variations of the output load do not cause significant variations of the input impedance. Preferably, the electronic module shows an input impedance greater than 1 kΩ. Particularly, the first electrode is structured to provide the first electrical signal including a noise component, and the differential amplifier is structured to amplify a difference signal obtained from the first electrical signal and said second electrical signal so substantially removing the noise component.

Particularly, said electronic module further includes: a high-pass filtering module connected to the first and second electrodes to filter the first and second electrical signal and provide corresponding first filtered signal and a second filtered signal to the differential amplifier having a respective output structured to produce a first amplified partial discharge signal. Particularly, the high-pass filtering module is structured to show a bandwidth defined by a lower frequency of 0.1 MHz and an upper frequency included into the range 10 MHz-100 MHz.

Advantageously, said electronic module further includes: an output filtering module structured to filter the amplified partial discharge signal and produce a second amplified partial discharge signal; and an impedance matching module structured to receive the second amplified partial discharge signal and provide on the transmission line a transmission partial discharge signal.

According to an embodiment of the invention, the electric field sensor is structured to place, in operation, the first electrode at a first distance from the electrical object and the second electrode at a second distance from the electrical object; wherein second distance is greater than the first distance.

Advantageously, said first electrode is also structured to detect from the electrical object a synchronization detected signal representing an AC electrical voltage supplying the electrical object; and the electronic module is configured to process the synchronization detected signal and provide an output synchronization detected signal on the transmission line.

Advantageously, said the electric field sensor also comprises an insulating layer arranged between the first electrode and the second electrode.

According to an embodiment, the first and second electrodes are made of flat electrical conductive sheets; a distance between the first and second electrodes is included into a range 1 mm-10 mm. Preferably, the first electrode shows a capacitive coupling with the second electrodes defined by a capacitance lower than 10 pF.

According to a particular embodiment, said transmission line comprises at least one of the following lines: transmission pair, twisted pair, coaxial cable. Advantageously, the transmission line comprises a first twisted pair structured to propagate the transmission partial discharge signal and a second twisted pair structured to propagate the output synchronization detected signal, preferably, the first and the second first twisted pair are included in a single cable.

Particularly, electric field sensor comprises a case housing the first electrode, the second electrode and the an electronic module; the first electrode is configured to show a capacitive coupling with the electrical object for values of said first distance lower than 10 mm.

According to a second aspect, the present invention relates to a method for acquiring partial discharge signals, comprising:
providing an electric field sensor comprising a first electrode capacitively coupled to an electric object and a second electrode isolated from the first electrode;
detecting by said first electrode a partial discharge signal generated by the electrical object and providing a corresponding first electrical signal,
detecting by said second electrode an environmental noise and providing a corresponding second electrical signal;
processing the first and second electrical signals and providing an output signal to be propagated on a transmission line;
decoupling the electric field sensor from the transmission line for substantially avoiding resonance of the electric field sensor with the transmission line;
propagating the output signal by the transmission line;
processing the output signal received from the transmission line to provide partial discharge amplitude values.

Particularly, processing the first and second electrical signals comprises subtracting the second electrical signal from the first electrical signal.

BRIEF DESCRIPTION OF THE DRAWINGS

Further characteristics and advantages will be more apparent from the following description of a preferred embodiment and of its alternatives given as a way of an example with reference to the enclosed drawings in which.

DETAILED DESCRIPTION

In the following description, same alphanumeric references are used for analogous exemplary elements when they are depicted in different drawings.

Figure 1:
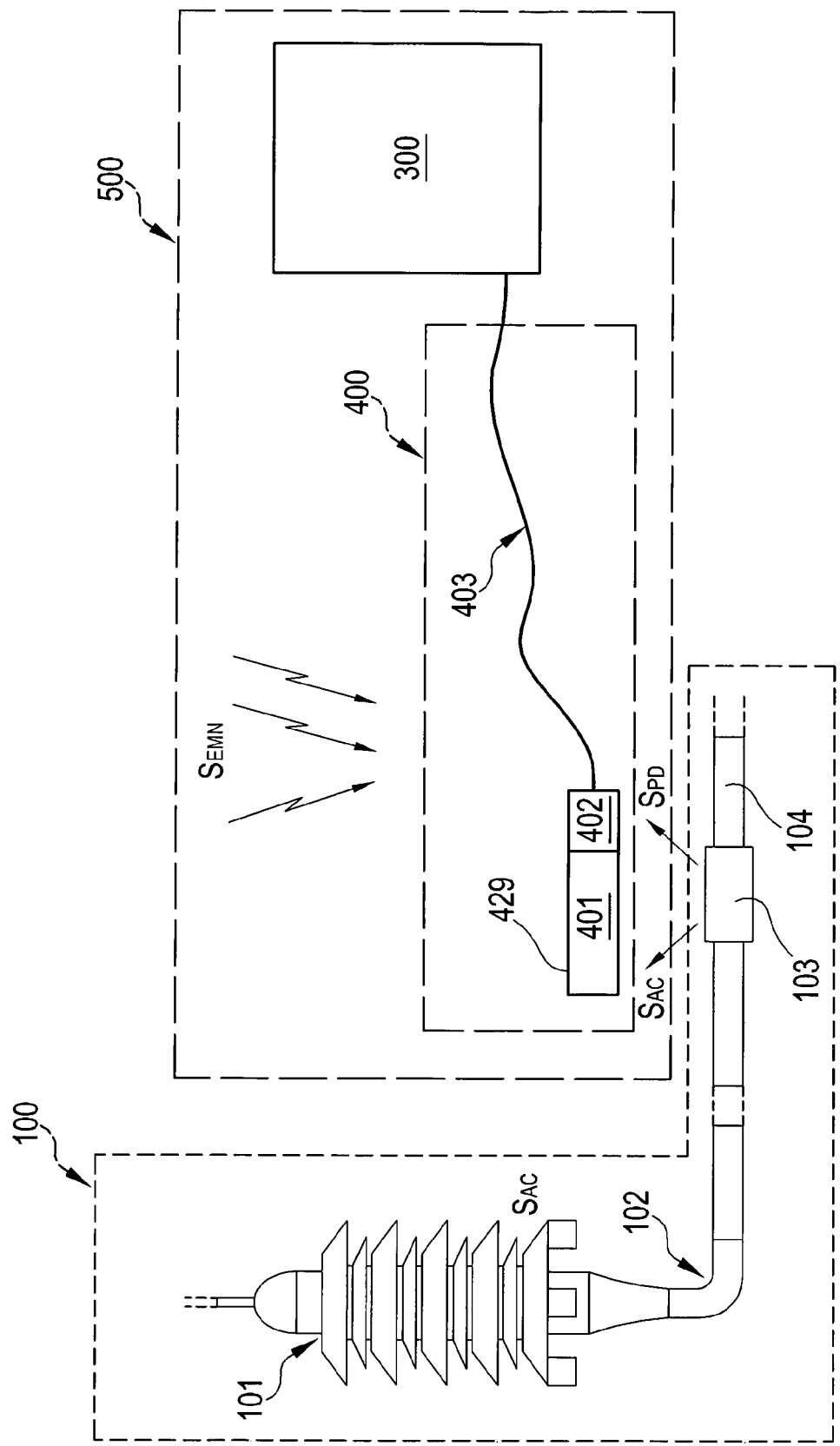
FIG. 1 shows an example of an electrical apparatus and a particular embodiment of a partial discharge acquisition system comprising a detection apparatus and an analysis device.

FIG. 1 shows an example of an electrical apparatus 100 and a particular embodiment of a partial discharge acquisition system 500 comprising a detection apparatus 400 and an analysis device 300. The partial discharge acquisition system 500 is an electronic apparatus employable to detect, measure and/or analyse partial discharges generated by electrical sources, as the electrical apparatus 100 itself. The electrical apparatus 100 can include any kind of electrical components, devices, apparatuses or systems such as an example: a medium or high voltage cable, a cable joint, an overhead line insulator, a medium or high voltage switchboard box, a medium or high voltage termination, a high and extra-high voltage cable using GIS (Gas Insulated Switchgear), an electric motor or generator or a medium or high voltage transformer.

Particularly, the electrical apparatus 100 includes a first electrical device 101, such as, by way of example, a medium or high voltage termination (MV/HV termination) as shown in FIG. 1, which is fed with an AC (Alternate Current) electrical voltage by means of a first electrical cable 102. In accordance with the embodiment described, the electrical apparatus 100 further includes a second electrical device 103, such as an example, a cable joint or a cross-bond joint which joints the first electrical cable 102 with a second electrical cable 104. As an example, the high voltage termination 101 and/or the cable joint 103 may produce and irradiate a synchronization signal $S_{AC}$ generated by and synchronized with the AC electrical voltage. Typically, AC electrical voltage has a frequency comprised between 1 Hz to about 1000 Hz. Moreover, in particular cases, the high voltage termination 101 and/or the cable joint 103 can produce a partial discharge signal $S_{PD}$. The partial discharge signal $S_{PD}$ includes electromagnetic wave pulses having frequencies included in the range 0.1 MHz to 100 MHz.

Figure 2:
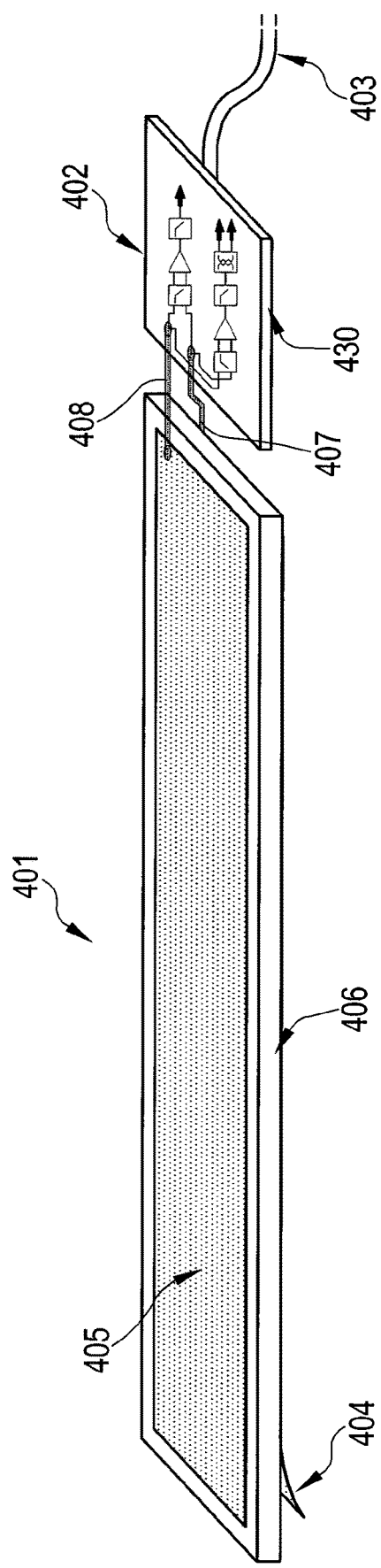
FIG. 2 shows an embodiment of an electric field sensor employable in said detection apparatus connected to an electronic circuit module, in turn connected to a transmission line.

As shown in FIG. 1, the detection apparatus 400 comprises an electric field sensor 401 and an electronic circuit module 402 housed in a sensor case 429, and a transmission line 403. With reference to FIG. 2, the electric field sensor 401 comprises a first conductive electrode 404 and a second conductive electrode 405 which can be made, in accordance with an example, by a respective conductive sheet, such as a metal sheet having, as an example, a thickness lower than 0.05 mm, preferably comprised between 0.01 mm and 0.05 mm. According to an example, both first 404 and second 405 electrodes have flat rectangular or quadrangular shapes. As an example, both first 404 and second 405 conductive electrodes can be made of copper, aluminium or polymer sheets. Particularly, the first conductive electrode 404 (hereinafter also called "first electrode"), which can be identical to the second conductive electrode 405 (hereinafter also called "second electrode"), shows, in accordance with a particular embodiment, a length of 100 mm and a width of 25 mm. It is observed that the dimensions of the first and second electrodes 404 and 405 influence the sensitivity of the electric field sensor 401 since smaller dimensions decrease the sensitivity, larger dimensions increase it. The first electrode 404 and the second electrode 405 can have a respective area in the range comprised between 0.1 cm$^2$ and 200 cm$^2$. In accordance with another example, both first and second electrodes 404 and 405 can be conductive or semiconductive polymer sheets made, as an example, of conductive plastic or silicone materials.

With reference to the particular embodiment shown in FIG. 2, the first electrode 404 is opposed to the second electrode 405 and, preferably, an insulating layer 406 is interposed between the first electrode 404 and the second electrode 405. The insulating layer 406 also acts as support base for the first electrode 404 and the second electrode 405. As an example, the insulating layer 406 includes a large percentage of air in order to show a low dielectric constant, i.e. close to 1. Particularly, plastic foams and/or bubble wrap foils can be employed to form the insulating layer 406. The insulating layer 406 can show a thickness included into the range 1 mm-10 mm, preferably 3 mm-7 mm, more preferably the thickness is 5 mm. In accordance with another example, the first electrode 404 and second electrode 405 can be placed on the same side of the insulating layer 406 but with a gap between them (e.g. of about 5 mm) so avoiding electrical contact.

Advantageously, the electrical field sensor 401 is designed to produce a very low capacitive coupling between the first electrode 404 and the second electrode 405. Particularly, even if the electric field sensor 401 could show of an intrinsic capacitor behaviour, it is designed to reduce or eliminate this behaviour. As an example, the electric field sensor 401 shows a capacitance between the first electrode 404 and the second electrode 405 lower than 10 pF, preferably lower than 8 pF, e.g. a possible value for the capacitance is 5 pF. On the other hand, an excessive distance between the first electrode 404 and the second electrode 405 to reduce the capacitive coupling is not convenient since it is preferable that the first electrode 404 and the second electrode 405 sense similar electric fields due to the surrounding environment. Particularly, as will be clearer later, the distance between the first 404 and second 405 electrodes influences the signal to noise ratio: larger distance decreases signal to noise ratio. Suitable values for the distances between the first electrode 404 and the second electrode 405 have been indicated above with reference to the thickness of the insulating layer 406. The Applicant notices that the distance value of 5 mm is particularly convenient for the example in which the first 404 and second 405 conductive electrodes shows dimensions 25×100 mm.

According to preferred embodiments, the first 404 and second 405 electrodes (realized with metal or conductive polymer sheets) have rectangular shapes, measure about 25×100 mm and are separated by an insulator layer 406 of light polyethylene foam or other equivalent insulating materials with very low dielectric constant (as possible close to 1, the same of air). In this cases, the electric field sensor 401 is quite soft and can be bent easily, his quality further increases by using conductive rubber for the first 404 and second 405 electrodes.

The electric field sensor 401 is a passive device capable of sensing variations on the nearby electric field. Particularly, the electric field sensor 401 is configured to detect the electric field variations associated with the partial discharge signal $S_{PD}$ produced, as an example, by the cable joint 103. Preferably, the electric field sensor 401 is configured to detect also the electric field variations associated with the synchronization signal $S_{AC}$ produced by the by the cable joint 103. In accordance with an embodiment, the electric field sensor 401 can sense signals having frequencies in the band ranging from 0.1 Hz to at least 100 MHz, so allowing the detection of both partial discharge signals and synchronization signals associated with AC electrical voltage.

In accordance with the described embodiment, the first electrode 404 is selected to detect the partial discharge signal $S_{PD}$ and the synchronization signal $S_{AC}$ while the second electrode 405 is selected to provide a voltage reference signal obtainable, as an example, by detecting electromagnetic field and noise $S_{EMN}$ from the environment. Considering that the cable joint 103 is the object under test, in operation the first electrode 404 is to be placed at a first distance d1 from the cable joint 103 which is lower than a second distance d2 between the second electrode 405 and the cable joint 103: d1<d2. In other words, in accordance with the given example, in operation, the first electrode 404 is placed nearer than the second electrode 405 to the cable joint 103. In this condition, the first electrode 404 shows a capacitive coupling with the cable joint 103 which is higher than the capacitive coupling that the first electrode 404 itself shows with the surrounding environment, and the second electrode 405 shows a capacitive coupling with the surrounding environment which is higher than the capacitive coupling that the second electrode 405 itself shows with the cable joint 103.

It is observed that if the second electrode 405 is selected to detect the partial discharge signal $S_{PD}$ and the synchronization signal $S_{AC}$, the second electrode 405 is selected to provide a voltage reference signal: the second electrode 405 is placed nearer to the cable joint 103 than the first electrode 404 (d2<d1). It is also noticed that, the above indicated structures of the electric field sensor 401 allows to achieve the different capacitive coupling of the first electrode 404 and the second electrode 405 basing on different distances from the cable joint 103. Different designs can be evaluated by using a Finite Element Method simulation.

The electrode used to detect the partial discharge signal $S_{PD}$ and the synchronization signal $S_{AC}$ (e.g. the first electrode 404) is configured to be placed very near to the electrical object under test (i.e. the cable joint 103) and, preferably the case 429 of the electric field sensor is in direct contact with an insulating sheath or insulating material of the electrical object itself. As an example, the distance of the first electrode 405 electrical object under test (e.g. the cable joint 103) is lower than 10 mm, preferably, lower than 5 mm, more preferably lower than 3 mm.

Figure 3:
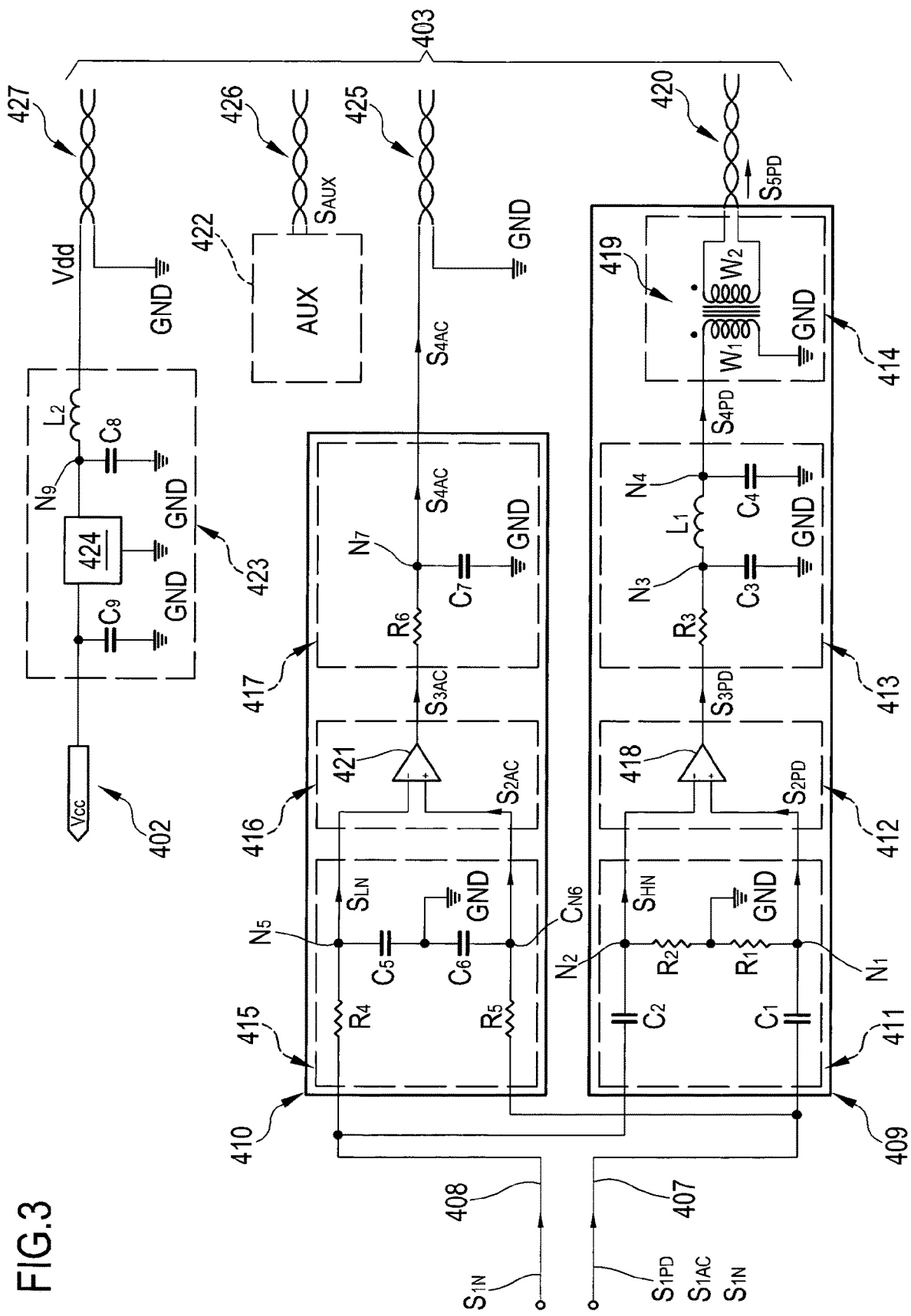

FIG. 3 schematically shows an example of the electronic circuit module 402 comprising a first input terminal 407 electrically connected to the first electrode 404 and a second input terminal 408 electrically connected to the second electrode 405. The first input terminal 407 is configured to receive a partial discharge detected signal $S_{1PD}$ corresponding to the partial discharge signal $S_{PD}$ detected by the first electrode 404. The second input terminal 408 is configured to receive a reference/noise detected signal $S_{1N}$ which corresponds to the electromagnetic noise $S_{EMN}$ (FIG. 1) detected by the second electrode 405 from the surrounding environment.

The electromagnetic noise $S_{EM}$ have typically frequencies included in the range 0.1 MHz to 100 MHz. Particularly, the first input terminal 407 can be also configured to receive a synchronization detected signal $S_{1AC}$ corresponding to the synchronization signal $S_{AC}$ also detected by the first electrode 404. Moreover, the electromagnetic noise $S_{EMN}$ can be also detected by the first electrode 404 so providing a respective reference/noise detected signal which can be considered substantially identical to the reference/noise detected signal $S_{1N}$ provided by the second electrode 405.

In greater detail, the electronic circuit module 402 shown in FIG. 3 is provided with a partial discharge circuit module 409 and a synchronization circuit module 410. The partial discharge circuit module 409 comprises: a high-pass filtering module 411, a first amplifying module 412, a first output filtering module 413 and an impedance matching module 414.

The high-pass filtering module 411 of the partial discharge circuit module 409 is connected to the first input terminal 407 to receive the partial discharge detected signal $S_{1PD}$, the synchronization detected signal $S_{1AC}$ and the reference/noise detected signal $S_{1N}$. The a high-pass filtering module 411 is also connected to the second input terminal 408 to receive the reference/noise detected signal $S_{1N}$ while the partial discharge detected signal $S_{1PD}$ and the synchronization detected signal $S_{1AC}$ are received with a lower power due to the greater distance of the second electrode 405 from the cable joint 103. The high-pass filtering module 411 is a passive filter configured to extract high frequency components from the signals at its inputs and shows, as an example, a corner frequency of 0.1 MHz: so the high-pass filtering module 411 eliminates or attenuates signal components having frequencies lower than 0.1 MHz.

In accordance with the example of FIG. 3, the high-pass filtering module 411 comprises a first high-pass filter including a first capacitor C1 connected between the first input terminal 407 and a first node N1. The first node N1 is connected to a first resistor R1 which is also connected to a ground terminal GND. The first high-pass filter C1-R1 is configured to extract from the signals at the first input terminal 407 the partial discharge detected signal $S_{1PD}$ and reject the synchronization detected signal $S_{1AC}$, so providing a filtered partial discharge signal $S_{2PD}$ (e.g. a voltage signal).

Moreover, the high-pass filtering module 411 comprises a second high-pass filter including a second capacitor C2 connected between the second input terminal 408 and a second node N2. The second node N2 is connected to a second resistor R2 which is also connected to the ground terminal GND. The second high-pass filter C2-R2 is configured to extract high frequency components from the noise detected signal $S_{1N}$, so providing a first filtered noise signal $S_{HN}$ (e.g. a voltage signal). Particularly, the high-pass filtering module 411 has an impedance seen from the electric field sensor 401 higher than 1 kΩ and preferably included into the range 1 kΩ-10 MΩ.

The first amplifying module 412 is provided with a first high impedance differential amplifier 418 having a non-inverting input "+" connected to the first node N1 and an inverting input "−" connected to the second node N2. The first high impedance differential amplifier 418 is configured to amplify the difference between the signals at its input, such as the filtered partial discharge signal $S_{2PD}$ (carrying also environment noise components) and the first filtered noise signal $S_{HN}$ so providing on a corresponding output an amplified partial discharge signal $S_{3PD}$. The first amplifying module 412 comprises, as an example, a gain included into the range 1-10.

The first high impedance differential amplifier 418 shows a structure that allows to decouple, i.e. to separate, the electric field sensor 401, connected to the input of electronic circuit module 402 from the transmission line 403 connected to the output of the electronic circuit module 402, with reference to the high frequency signals, i.e. the partial discharge detected signal $S_{1PD}$. This decoupling avoids that the electric field sensor 401 and the transmission line 403 were directly connected and could resonate, so avoiding that that the electric field sensor 401 showed a resonant frequency response for the partial discharge content. In particular, the first high impedance differential amplifier 418 shows an input impedance which is constant with respect to the operation frequency. Moreover, preferably the input impedance (i.e. impedance seen at the input terminals) is independent from an output load (i.e. the amplifier load, that is the impedance seen from the output terminals of the high impedance differential amplifier 418) of the same first high impedance differential amplifier 418. In particular, variations of the output load do not cause variations of the input impedance. In this way, thanks to the presence of the first high impedance differential amplifier 418, the electric field sensor 401 is not affected by the inductive behaviour of the transmission line 403.

Preferably, the first high impedance differential amplifier 418 shows a high input impedance and a low output impedance. As an example, the first high impedance differential amplifier 418 shows an input impedance higher than 1 MΩ. MΩ. Moreover, as an example, the output impedance of the first high impedance differential amplifier 418 is lower than 50Ω, preferably lower than 10Ω. In accordance with this example, the impedance seen at the input electronic circuit module 402 is higher than 1 kΩ. These impedance values ensure that the operation of the electric field sensor 401 is not influenced by the electronic circuit module 402.

As an example, the frequency bandwidth of the first high impedance differential amplifier 418 shows a lower frequency of 0.1 MHz and an upper frequency included into the range 10 MHz-100 MHz depending on the specific applications. Particularly, for partial discharge measurements on electrical cables, an upper frequency of 50 MHz can be employed; for partial discharge measurements on electrical motors, an upper frequency of 20 MHz can be employed and with reference to transformers or other electrical devices an upper frequency of 100 MHz is advisable. The high impedance differential amplifier 418 can include an operational amplifier with a single output having a transistor pair in a differential configuration.

The first output filtering module 413 is configured to perform a low-pass filtering (e.g. from 20 to 100 MHz) to reduce noise amplified by the first amplifying module 412 and producing an output partial discharge signal $S_{4PD}$. In accordance with the example of FIG. 3, the first output filtering module 413 includes a third resistor R3 connected between the output of the first amplifying module 412 and a third node N3 which is connected to the ground terminal GND by means of a third capacitor C3. The third node N3 is connected to a fourth node N4 by means of a first inductor L1 and to the ground terminal GND via a fourth capacitor C4. Thanks to the first inductor L1, it is possible to attenuate a partial discharge signal $S_{PD}$ with a quick response.

The impedance matching module 414 is connected between the output filtering module 413 and the transmission line 403 and is configured to provide an impedance adaptation ensuring a satisfying power transmission of the output partial discharge signal $S_{4PD}$ towards the transmission line 403. Preferably, the impedance matching module 414 is also configured to provide a conversion from a single-ended configuration to differential configuration. In accordance with the example shown in FIG. 3, the impedance matching module 414 includes an electronic transformer 419 comprising a primary winding W1 and a secondary winding W2. The primary winding W1 is connected between the fourth node N4 of the output filtering module 413 and the ground terminal GND. Particularly, the secondary winding W2 is connected to a partial discharge transmission line 420 of the transmission line 403 having, as an example, an impedance of 100Ω (differential). The secondary winding W2 of the electronic transformer 419 is structured to provide a transmission partial discharge signal $S_{5PD}$ to the partial discharge transmission line 420.

Reference is now made to the synchronization circuit module 410 which comprises: a low-pass filtering module 415, a second amplifying module 416 and a second output filtering module 417. The low-pass filtering module 415 is connected to the first input terminal 407 to receive the partial discharge detected signal $S_{1PD}$ and the synchronization detected signal $S_{1AC}$ (also including environment components) and to the second input terminal 408 to receive the noise detected signal $S_{1N}$. The low-pass filtering module 415 is a passive filter configured to extract low frequency components from the signals at its inputs and shows, as an example, a corner frequency of 10 kHz: so the low-pass filtering module 415 attenuates or eliminates the signal components having frequency higher than 10 kHz (namely the partial discharge signal $S_{PD}$).

In accordance with the example of FIG. 3, the low-pass filtering module 415 comprises a first low-pass filter including a fourth resistor R4 connected between the second input terminal 408 and a fifth node N5. The fifth node N5 is connected to a fifth capacitor C5 which is also connected to the ground terminal GND. The first low-pass filter R4-C5 is configured to extract low frequency components from the noise detected signal $S_{1N}$, so providing a second filtered noise signal $S_{LN}$ (e.g. a voltage signal). The low-pass filtering module 415 also includes a second low-pass filter comprising a fifth resistor R5 connected between the first input terminal 407 and a sixth node N6 which is connected to the ground terminal GND by means of a sixth capacitor C6. The first low-pass filter R5-C6 is configured to extract from the signals at the first input terminal 407 the synchronization detected signal $S_{1AC}$ and reject the partial discharge detected signal $S_{1PD}$, so providing a filtered synchronization detected signal $S_{2AC}$. Preferably, the low-pass filtering module 415 shows an input impedance equal or greater than 10 MΩ.

The second amplifying module 416 is provided with a second high impedance differential amplifier 421 having a non-inverting input "+" connected to the sixth node N6 and an inverting input "−" connected to the fifth node N5. The second high impedance differential amplifier 421 is configured to amplify the difference between the filtered synchronization detected signal $S_{2AC}$ (also including environment noise content) and the second filtered noise signal $S_{LN}$ and provide on a corresponding output an amplified synchronization signal $S_{3AC}$. The second high impedance differential amplifier 421 shows, as an example, a gain A included into the range 100-1000 and an input impedance equal or greater than 10 MΩ.

As an example, the frequency bandwidth of the second high impedance differential amplifier 421 is equal or lower than 1 kHz. It is observed that for the frequencies of the synchronization detected signal $S_{1AC}$ the electric field sensor 401 does not resonate with the transmission line 403. However, the impedance of the second high impedance differential amplifier 421 allows to decouple the electric field sensor 401 from the transmission line 403. The second high impedance differential amplifier 421 can include a respective operational amplifier with a single output having a transistor pair in a differential configuration.

The second output filtering module 417 is configured to perform a low-pass filtering (e.g. 1 kHz) to reduce potential higher frequency noise outputted by the second amplifying module 416 and producing an output synchronization signal $S_{4AC}$. In accordance with the example of FIG. 3, the second output filtering module 417 includes a sixth resistor R6 connected between the output of the second amplifying module 416 and a seventh node N7 which is connected to the ground terminal GND by means of a seventh capacitor C7.

According to a particular embodiment, the detection apparatus 400 includes an auxiliary sensor module 422 (AUX, FIG. 3) structured to provide additional and valuable diagnostic information from the detection apparatus 400. The auxiliary sensor module 422 can be integrated into the electronic circuit module 402 and comprises a temperature sensor and a Hall effect current sensor (not shown). The temperature sensor and the Hall effect current sensor are monolithic integrated circuit directly providing an auxiliary sensor output signal $S_{AUX}$ that can be connected to an output cable.

As an example, the electronic circuit module 402 also comprises a power supply module 423 configured to provide a stabilized supplying voltage Vcc to the active components of electronic circuit module 402. The electronic circuit module 402 is connectable to the analysis device 300, or to other electric power source, to receive an electrical supply voltage Vdd and, in accordance with an example, comprises filtering components such as a second inductor L2 having a terminal connected to a ninth node N9 which is connected to ground terminal GND via an eighth capacitor C8. Moreover, the power supply module 423 includes a voltage regulator module 424 which is configured to produce the stabilized supply voltage Vcc and is also connected to ninth capacitor C9, connected to the ground terminal.

In accordance with a particular embodiment, the electronic circuit module 402 is integrated into a printed circuit board 430 (FIG. 2) in a two layer standard FR4 PCB or on a Kapton flexible printed circuit, in order to increase the bendability and softness. As known to the skilled person FR-4 is a composite material composed of woven fiberglass cloth with an epoxy resin binder that is flame resistant (self-extinguishing). As an example, the electronic circuit module 402 shows overall dimensions of about 30×30 mm. As an example, the stabilized supplying voltage Vcc is an DC voltage equal to 5 V and the electrical supply voltage Vdd is a an DC voltage equal to 9 V. The voltage regulator circuit can be a simple Zener diode or a linear voltage regulator such as the 7805 or LM317 integrated circuit Moreover, according to a particular embodiment, the electric field sensor 401 and the electronic circuit module 402 are enclosed in plastic or siliconic rubber mold case 429, so obtaining mechanical strength and isolation from water and dust (the mold can be IP67). Usually the mold case 429 has approximately the shape of a medical patch and can be made adhesive on one side (so to stick to the object under test) by using a suitable glue.

Reference is now made to the transmission line 403 (FIG. 1) connecting the electronic circuit module 402 to the analysis device 300. Particularly, the transmission line 403 is structured to transmit the transmission partial discharge signal $S_{5PD}$, the output synchronization signal $S_{4AC}$ and the auxiliary sensor output signal $S_{AUX}$ to the analysis device 300 from the electronic circuit module 402. Moreover, in accordance with the described example, the transmission line 403 is configured to provide the electrical supply voltage Vdd to the power supply module 423 from the analysis device 300.

The transmission line 403 can employ one or more of the following transmission lines: transmission pair, twisted pair, coaxial cable. Preferably, twisted pairs are employed since they allow preserving signal bandwidth and reducing electromagnetic interferences. As an example, the transmission line 403 has a length comprised between 5 m-20 m, preferably included in 5 m-10 m.

In accordance with the described example, the partial discharge transmission line 420, connecting the impedance matching module 414 to the analysis device 300, is a first twisted pair comprising two conductors each connected to another terminal of the secondary winding W2 of the electronic transformer 419. Therefore, in accordance with this example, the transmission partial discharge signal $S_{5PD}$ is a differential signal.

With reference to the output synchronization signal $S_{4AC}$, the transmission line 403 includes, preferably, a second twisted pair 425 connecting the second output filtering module 417 to the analysis device 300. Particularly, the second twisted pair 425 includes a first conductor connected to the seventh node N7 to receive the output synchronization signal $S_{4AC}$ and a second conductor connected to the ground terminal GND. Therefore, in accordance with this example, the output synchronization signal $S_{4AC}$ is a single-ended signal.

Moreover, the transmission line 403 comprises at least a third twisted pair 426 to propagate the auxiliary sensor output signal $S_{AUX}$. The transmission line 403 also includes a fourth twisted pair 427 to differentially carry the electrical supply voltage Vdd (preferably provided by the analysis device 300) towards the power supply module 423. At the side of the power supply module 423, a conductor of the fourth twisted pair 427 is connected to the second inductor L2 and another conductor of the fourth twisted pair 427 is connected to the ground terminal GND.

The transmission line 403 can be a single cable housing a plurality of transmission lines or can comprise separated cables. Preferably, the transmission line 403, including the above mentioned first twisted pair 420, second twisted pair 425, third twisted pair 426 and fourth twisted pair 427, is a single cable. As an example, this single cable is a 4-pair standard twisted pair cable, such as the ANSI/TIA/EIA-568-A, i.e. the Ethernet Cat5e or Cat6 cables (e.g. Unshielded Twisted Pair UTP, Shielded Twisted Pair STP, Foiled Twisted Pair FTP or others). The choice of these types of single cable is advantageous from many point of views since they are standard cables, having at low cost and showing: adequate frequency performances (e.g. cut off frequency >100 MHz), standard and precise impedance value (100 Ohm), good immunity to interference, possibility of using differential signalling and shields. The conductors of the transmission line 403 are connected to the electronic circuit module 402 and to the analysis device 300 by corresponding connectors. As an example, RJ-45 connectors and 8P8C modular type socket can be used.

Moreover, the electric field sensor 401 is structured to show a flat frequency response in the bandwidth of the partial discharge signal $S_{PD}$ (0.1 MHz-100 MHz). Particularly, the frequency response amplitude of the electric field sensor 401 shows variations lower than 5% of its average amplitude and preferably, lower than 3%.

Figure 4:
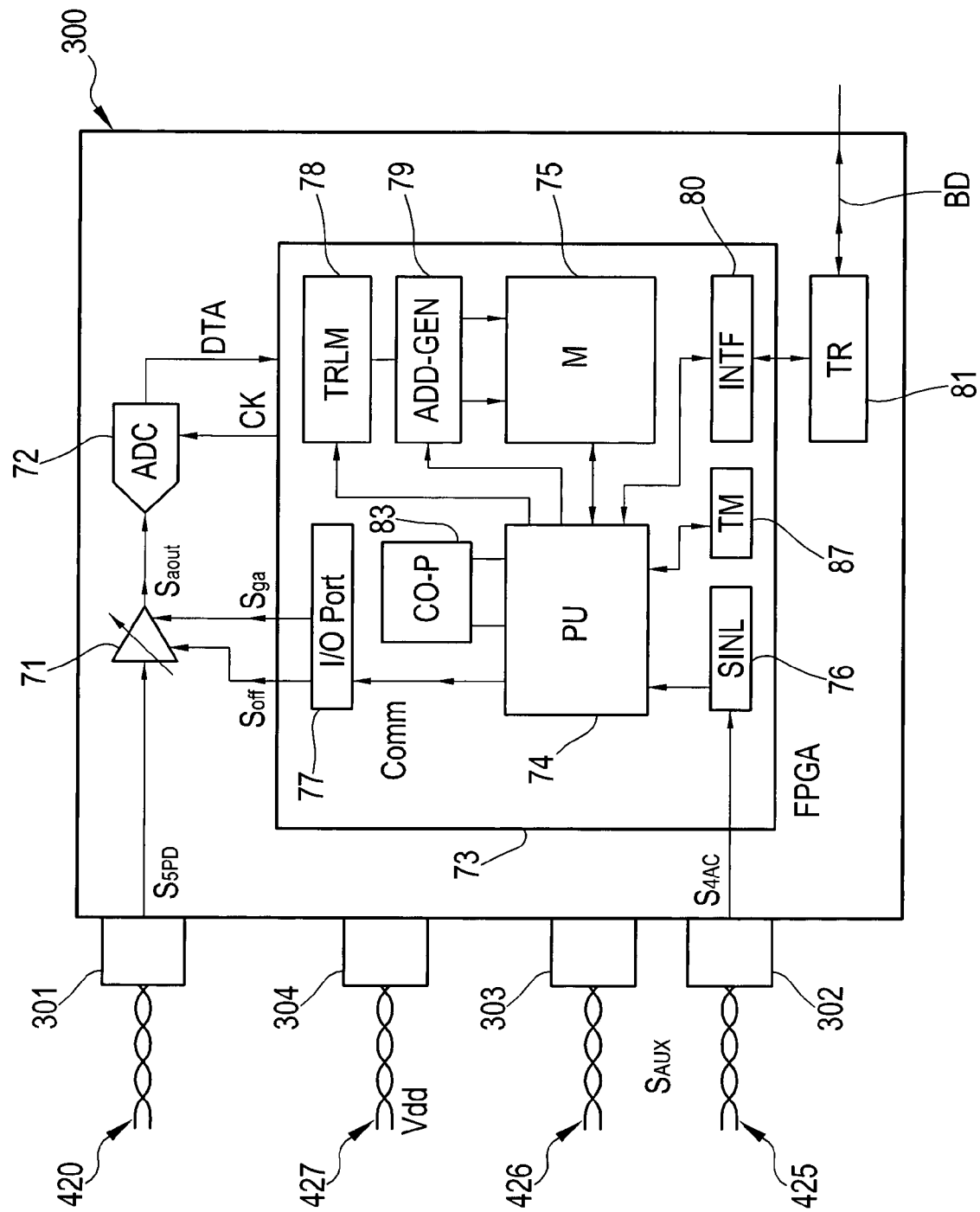
FIG. 4 schematically shows an example of the analysis device 300 employable in said partial discharge acquisition system.

FIG. 4 shows an example of the analysis device 300 which is configured to receive the transmission partial discharge signal $S_{5PD}$ from the first twisted pair 420 and perform processing steps to produce a plurality digital samples representing transmission partial discharge signal $S_{5PD}$. Particularly, the analysis device 300 is configured to represent a pulse waveform transmission partial discharge signal $S_{5PD}$ with a number of samples comprised between 32 and 256. As an example, the analysis device 300 is structured to perform analog-to-digital conversion, selection, acquisition and synchronization processing steps.

According to the illustrated example, the analysis device 300 comprises a first input port 301 connected to the first twisted pair 420, a second input port 302 connected the second twisted pair 425, a third input port 303 connected to the third twisted pair 426 and a fourth input port 304 connected to the fourth twisted pair 427. As an example, the first input port 301 includes a differential to single-ended converter configured to convert the transmission partial discharge signal $S_{5PD}$ which has been received in a differential form into a single-ended signal. The differential to single-ended converter of the first input port 301 can include a termination resistor (e.g. having a resistance of 100Ω) and a transformer or a or differential to single-ended amplifier. A differential to single-ended converter, analogous to the one of the first input port 301, can be included into the second input port 302 and the third input port 303.

Moreover, the second input port 302 and the third input port 303 can comprise a respective filtering and buffering device which can be implemented as an example, with a RC low pass filter. The fourth input port 304 provides the electrical supply voltage Vdd. The devices included into the fourth input port 304 can be powered by a low voltage (3-5V DC) or power supply network, by means of a linear voltage regulator.

The analysis device 300 further comprises an optional wide band programmable amplifier 71 having an input connected to first twisted pair 420 and a respective output connected to an analog-to-digital converter 72 (ADC). The analysis device 300 also includes a control module 73 such as a Field Programmable Gate Array (FPGA) which is structured to control the wide band programmable amplifier 71 and receive data from the analog-to-digital converter 72. The wide band programmable amplifier 71 can be programmed to impart to the discharge output signal $S_{d-out}$ an offset value and an amplification gain value by means of offset signal $S_{off}$ and a gain signal $S_{ga}$ provided by the control module 73, so producing an amplified output signal $S_{aout}$.

The wide band programmable amplifier 71 allows, as an example, a continuous gain variation ranging from about −5 dB to +40 dB. The analog-to-digital converter 72 is structured to be synchronised by a clock signal CK generated by the control module 73 and generate converted data DTA to be sent to the control module 73. The analog-to-digital converter 72 is, as an example, capable of converting 250 mega-samplers per second with an 8 bit resolution. This sampling frequency allows acquiring the discharge electrical signal $S_{d\text{-}out}$ with a time resolution of 4 ns. It is observed that most partial discharge pulses are usually longer that 0.5 µs. Particularly, the control module 73 includes a processing unit 74 (PU), such as a microprocessor, a memory 75 (M), such as a RAM (Random Access Memory), and a synchronization logic module 76 (SINL). More particularly, the memory 75 can be a circular buffer. The processing unit 74 is connected to a timing module 87 (TM) which provides a clock signal. The synchronization logic module 76 is configured to receive the output synchronization signal $S_{4AC}$ from the second twisted pair 425, extract from it the carried timing information, such as the period and phase of the AC electric voltage, and transfer the information to the processing unit 74.

An input/out port 77 allows transferring output commands Comm generated by the processing unit 74 to the wide band programmable amplifier 71 under the form of the offset signal $S_{off}$ and the gain signal $S_{ga}$. The control module 73 is also provided with a trigger module 78 (TRLM) and with an address generation module 79 (ADD-GEN) configured to generate the addresses necessary to write new data in the memory 75 and read data stored in the memory 75, under the control of the processing unit 74. The trigger module 78 is structured to perform a discharge signals acquisition process and is configured to trigger the memorisation of samples of the amplified output signal $S_{aout}$ exiting the wide band programmable amplifier 71 only for samples of the amplified output signal $S_{aout}$ such as, for example, only for positive or negative pulses having amplitude (i.e. an absolute value) greater than a threshold level. The trigger logic module 78 can be a logic module comprising one or more comparators to compare the values of the samples provided by the analog-to-digital converter with one or more thresholds.

Moreover, the control module 73 comprises a host interface module 80 (INTF) allowing data transfer to a transceiver 81 (TR), such as an example a USB/Ethernet transceiver, which is configured to exchange data/commands with a further processor (not shown) which is, as an example, external to the partial discharge acquisition system 500, by a wired or wireless connection line BD. The external processor is configured to perform processing an analysis of the received data allowing, for example, representation of the discharge pulse behaviour on a display or memorization for subsequent processing and consulting. Particularly, the further processor allows displaying and analysing the partial discharge pulse waveforms and parameters that can be phase referenced by using the output synchronization signal $S_{4AC}$.

The control module 73 can be also provided with an extraction module 83 (e.g. a co-processor CO-P) connected to the processing unit 74 which is configured to perform extraction, particularly, real-time extraction of pulse features from the data store in the memory 79. Examples of possible pulse features extracted by the co-processor are: peak value and polarity, phase, energy, duration and rough estimation of Weibull parameters.

The analysis device 300 is also configured to condition, amplify, convert into digital form, process, store, transmit the auxiliary sensor output signal $S_{AUX}$ as an example, by means of optional multiplexer (not shown) for routing signals of a specific auxiliary sensor to the subsequent amplification and conversion stage.

In operation, the case 429 (FIG. 1), including the electric field sensor 401 and electronic circuit module 402, is positioned so as to be in direct contact with an electrical isolated portion of the cable joint 103. The case 429 can be positioned under the ground surface and fixed by a glue to the cable joint 103. The analysis device 300, connected to the case 429 with the transmission line 403, can be placed at a distance of 5-20 m from the cable joint 103. The electrical power feeding the first and second electrical cables 102 and 104 can be discontinued to allow the fixing of the case 429 to the cable joint 103 and is subsequently switched on so starting the detection, acquisition and analysis steps. The active components (such as the first amplifying module 412 and the second amplifying module 416) of the control circuit module 402 receive the stabilized supplying voltage Vcc obtained from the electrical supply voltage Vdd.

The first electrode 404 positioned near the cable joint 103 detects the partial discharge signal $S_{PD}$, the synchronization signal $S_{AC}$, and a portion of the electromagnetic noise $S_{EMN}$ and provides on the first terminal 407 (FIG. 2) the respectively corresponding partial discharge detected signal $S_{1PD}$, synchronization detected signal $S_{1AC}$ and reference/noise detected signal $S_{1N}$. The second electrode 405, which is more distant from the cable joint 103 than the first electrode 404, mostly detects the electromagnetic noise $S_{EMN}$ and provides on the second terminal 408 (FIG. 2) the corresponding reference/noise detected signal $S_{1N}$.

The high-pass filtering module 411 performs the extraction of the high frequency components of the signal at its inputs so providing the filtered partial discharge signal $S_{2PD}$ and the first filtered noise signal $S_{HN}$. The first high impedance differential amplifier 418 performs the amplification of the difference between the filtered partial discharge signal $S_{2PD}$ and the first filtered noise signal $S_{HN}$ so removing the noise components carried by the filtered partial discharge signal $S_{2PD}$ and outputting the amplified partial discharge signal $S_{3PD}$. The amplified partial discharge signal $S_{3PD}$ is low pass filtered by the first output filtering module 413 obtaining the output partial discharge signal $S_{4PD}$. The output partial discharge signal $S_{4PD}$ is converted into the transmission partial discharge signal $S_{5PD}$ and so is transmitted in a differential form on the first twisted pair 420. The transmission on the first twisted pair 420 is performed in the course of the detection of the partial discharge signal $S_{PD}$.

As also indicated before, the transmission line 403 propagating the transmission partial discharge signal $S_{5PD}$ (in accordance with the example, the twisted pair 420), having an inductive behaviour, could resonate with the electric field sensor 401, which can be schematized as a capacitor. This resonant behaviour could distort the detected pulses associated with the partial discharge signal $S_{PD}$. The use of a first amplifying module 412 structured to separate the electric field sensor 401 from the transmission line 403 allows to avoid resonance of the first twisted pair 420 with the electric field sensor 401. The detection apparatus 400 shows therefore a non-resonant behaviour since it does not comprise resonant components in the bandwidth 0.1 MHz-100 MHz.

The low-pass filtering module 415 performs the extraction of the low frequency components of the signal at its inputs so providing the filtered synchronization detected signal $S_{2AC}$ and the second filtered noise signal $S_{LN}$. The second high impedance differential amplifier 421 performs the amplification of the difference between the filtered synchronization detected signal $S_{2AC}$ and the first filtered noise signal $S_{LN}$ so removing the noise components carried by the filtered synchronization detected signal $S_{2AC}$ and outputting the amplified synchronization signal $S_{3AC}$. The amplified synchronization signal $S_{3AC}$ is low pass filtered by the second output filtering module 417 so obtaining the output synchronization signal $S_{4AC}$. The output synchronization signal $S_{4AC}$ is transmitted on the second twisted pair 425. The auxiliary sensor output signal $S_{AUX}$, corresponding to the signals detected by the auxiliary sensor module 422, is transmitted on the third twisted pair 426.

The analysis device 300 receives the transmission partial discharge signal $S_{SPD}$ and the output synchronization signal $S_{AAC}$ and processes them to store and/or represent the partial discharge signal $S_{PD}$ by amplitude samples referenced to phase values of the AC electrical voltage $S_{AC}$.

Figure 5:
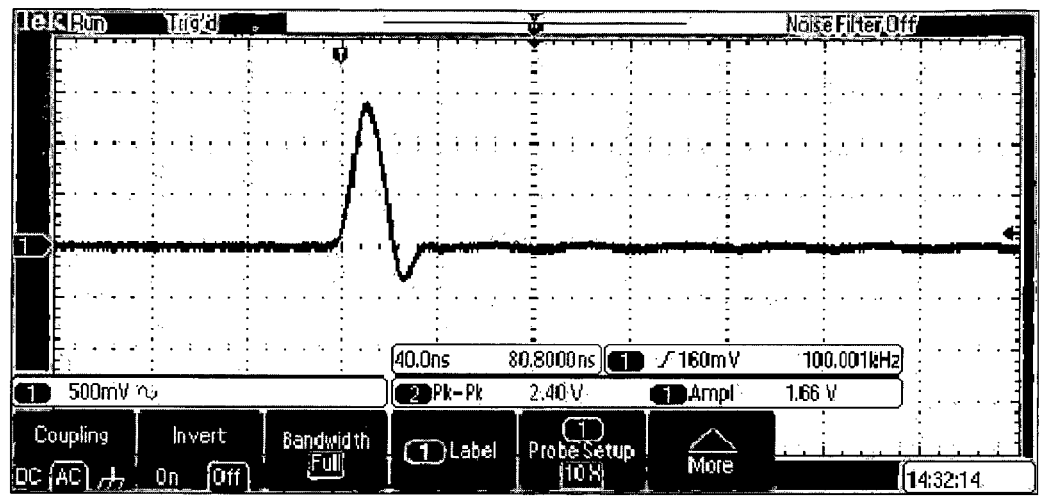
FIG. 5A and 5B refer to experimental results concerning the detection of partial discharge pulses.
Figure 5:
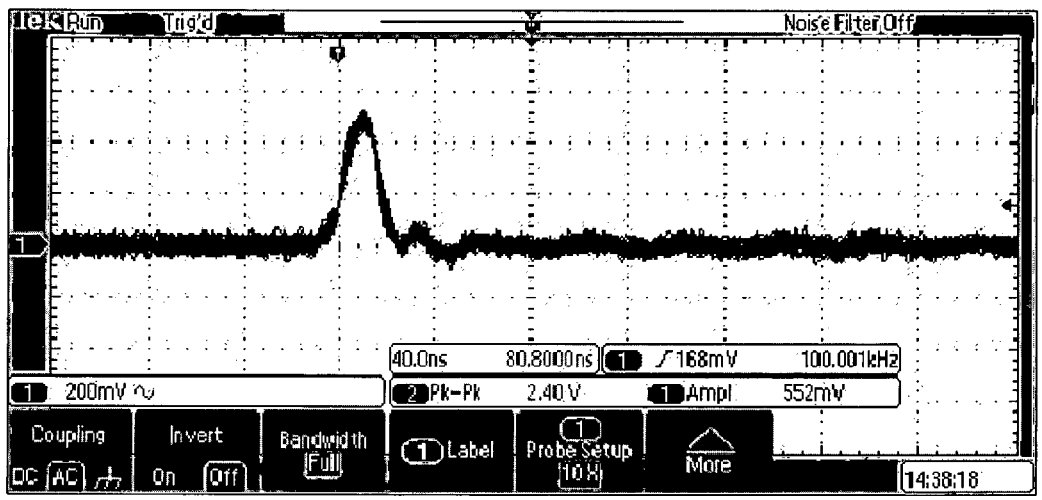

The Applicant has manufactured a partial discharge acquisition system 500 analogous to the type described above and has tested his performances. Particularly, a 20 ns pulse, as shown in FIG. 5A, has been generated by a signal generator to simulate a partial discharge pulse. The generated pulse has been transmitted with a wideband antenna and has been detected with an electrical field sensor 401 analogous to the one of FIG. 2, processed by the electronic circuit module 402 and transmitted to the analysis device 300 by a twisted pair 420. FIG. 5B shows the pulse shape as reproduced by the analyses device 300: the pulse shape is preserved so proving a non-resonant behaviour.

The partial discharge acquisition system 500 can provide high signal quality thanks to the non-resonant behaviour, which can be further increased by the differential processing. Moreover, the partial discharge acquisition system 500 can offer high detection sensitivity and immunity to distortion of the signals on the transmission line. A further advantage is connected to the possibility of detect also the AC electrical voltage and other physical quantities. The described electric field sensor can be made with materials ensuring a limited weight and its flat shape allows the bendability to the electric object under test.

The invention claimed is:

1. A partial discharge detecting device, comprising: an electric field sensor comprising: a first electrode configured to detect by capacitive coupling a partial discharge signal generated by an electrical object and to provide a corresponding first electrical signal; and a second electrode isolated from the first electrode and structured to detect an environmental noise and to provide a corresponding second electrical signal; a transmission line structured to propagate an output signal obtained from the electric field sensor toward an external analysis apparatus; and an electronic module connected to the first and second electrodes and structured to process the first and second electrical signals and to provide the output signal to the transmission line, wherein the electronic module is structured to decouple the electric field sensor from the transmission line and to substantially avoid resonance of the electric field sensor with the transmission line while propagating the output signal by the transmission line, wherein said electronic module further comprises: a differential amplifier electrically connected to the first and second electrodes and having an input impedance independent from an output load seen from said differential amplifier; a high-pass filtering module connected to the first and second electrode to filter the first and second electrical signals and to provide a corresponding first filtered signal and a second filtered signal to the differential amplifier having a respective output structured to produce a first amplified partial discharge signal; an output filtering module structured to filter the amplified partial discharge signal and to produce a second amplified partial discharge signal; and an impedance matching module structured to receive the second amplified partial discharge signal and to provide on the transmission line a transmission partial discharge signal.

2. The partial discharge detecting device of claim 1, wherein the electronic module shows a respective input impedance greater than 1 kO.

3. The partial discharge detecting device of claim 1, wherein: the first electrode is structured to provide the first electrical signal comprising a noise component; and the differential amplifier is structured to amplify a difference signal obtained from the first electrical signal and said second electrical signal thereby substantially removing the noise component.

4. The partial discharge detecting device of claim 1, wherein the high-pass filtering module is structured to show a bandwidth defined by a lower frequency of 0.1 Hz and an upper frequency in a range of 10 MHz-100 MHz.

5. The partial discharge detecting device of claim 1, wherein the electric field sensor is structured to place, in operation, the first electrode at a first distance from the electrical object, and the second electrode at a second distance from the electrical object, wherein the second distance is greater than the first distance.

6. The partial discharge detecting device of claim 1, wherein the first electrode is also structured to detect from the electrical object a synchronization detected signal representing an AC electrical voltage supplying the electrical object; and the electronic module is configured to process the synchronization detected signal and to provide an output synchronization detected signal on the transmission line.

7. The partial discharge detecting device of claim 1, wherein the electric field sensor also comprises an insulating layer arranged between the first electrode and the second electrode.

8. The partial discharge detecting device of claim 7, wherein: the first and second electrodes are made of flat electrical conductive sheets; and a distance between the first and second electrodes is in a range of 1 mm-10 mm.

9. The partial discharge detecting device of claim 1, wherein the first electrode shows a capacitive coupling with the second electrode defined by a capacitance lower than 10 pF.

10. The partial discharge detecting device of claim 1, wherein the transmission line comprises at least one of the following lines: a transmission pair, a twisted pair and a coaxial cable.

11. The partial discharge detecting device of claim 6, wherein the transmission line comprises: a first twisted pair structured to propagate the transmission partial discharge signal; and a second twisted pair structured to propagate the output synchronization detected signal.

12. The partial discharge detecting device of claim 9, wherein the transmission line comprises: a first twisted pair structured to propagate the transmission partial discharge signal; and a second twisted pair structured to propagate the output synchronization detected signal.

13. The partial discharge detecting device of claim 5, wherein the electric field sensor comprises a case holding the first electrode, the second electrode and the electronic module, the first electrode being configured to show a capacitive coupling with the electrical object for values of said first distance lower than 10 mm.

14. A method for acquiring partial discharge signals, comprising: providing an electric field sensor comprising a first electrode capacitively coupled to an electrical object and a second electrode isolated from the first electrode; detecting by said first electrode a partial discharge signal generated by the electrical object and providing a corresponding first electrical signal; detecting by said second electrode an environmental noise and providing a corresponding second electrical signal; processing the first and second electrical signals and providing an output signal to be propagated on a transmission line; decoupling the electric field sensor from the transmission line for substantially avoiding resonance of the electric field sensor with the transmission line while propagating the output signal by the transmission line; propagating the output signal by the transmission line; and processing the output signal received from the transmission line to provide partial discharge amplitude values, wherein the processing of electrical and output signals is performed by an electronic module, and the electronic module comprises: an output filtering module structured to filter an amplified partial discharge signal and to produce a second amplified partial discharge signal; and an impedance matching module structured to receive the second amplified partial discharge signal and to provide on the transmission line a transmission partial discharge signal.

15. The method of claim 14, wherein processing the first and second electrical signals comprises: subtracting the second electrical signal from the first electrical signal.

16. The partial discharge detecting device of claim 1, wherein the transmission line comprises at least one of the following lines: a transmission pair, a twisted pair and a coaxial cable.

17. The method of claim 14, wherein the transmission line comprises at least one of the following lines: a transmission pair, a twisted pair and a coaxial cable.

* * * * *